United States Patent
Kitamura et al.

(10) Patent No.: US 12,252,632 B2
(45) Date of Patent: Mar. 18, 2025

(54) CHEMICAL-MECHANICAL POLISHING COMPOSITION, RINSE COMPOSITION, CHEMICAL- MECHANICAL POLISHING METHOD, AND RINSING METHOD

(71) Applicant: CMC Materials KK, Aurora, IL (US)

(72) Inventors: Hiroshi Kitamura, Tsu (JP); Tsuyoshi Masuda, Tsu (JP); Yoshiyuki Matsumura, Nara (JP); Akihisa Namiki, Tsu (JP); Takeshi Saito, Tsu (JP)

(73) Assignee: ENTEGRIS, INC., Billerica, MA (US)

( * ) Notice: Subject to any disclaimer, the term of this patent is extended or adjusted under 35 U.S.C. 154(b) by 435 days.

(21) Appl. No.: 17/620,181

(22) PCT Filed: Jun. 11, 2020

(86) PCT No.: PCT/JP2020/023089
§ 371 (c)(1),
(2) Date: Dec. 17, 2021

(87) PCT Pub. No.: WO2020/255862
PCT Pub. Date: Dec. 24, 2020

(65) Prior Publication Data
US 2022/0372329 A1 Nov. 24, 2022

(30) Foreign Application Priority Data

Jun. 17, 2019 (JP) ................................. 2019-112143

(51) Int. Cl.
C09G 1/02 (2006.01)
C11D 1/62 (2006.01)
H01L 21/306 (2006.01)

(52) U.S. Cl.
CPC .................. C09G 1/02 (2013.01); C11D 1/62 (2013.01); H01L 21/30625 (2013.01)

(58) Field of Classification Search
None
See application file for complete search history.

(56) References Cited

U.S. PATENT DOCUMENTS

| | | | |
|---|---|---|---|
| 2009/0087989 A1* | 4/2009 | Kamimura | C09G 1/02 438/693 |
| 2010/0279507 A1 | 11/2010 | Guo | |
| 2016/0189973 A1 | 6/2016 | Tabata | |
| 2021/0115297 A1* | 4/2021 | Petro | B24B 37/044 |

FOREIGN PATENT DOCUMENTS

| | | |
|---|---|---|
| CN | 101397482 A | 4/2009 |
| CN | 106463382 A | 2/2017 |
| CN | 107208005 A | 9/2017 |
| JP | 2008244450 A | 10/2008 |
| JP | 2009081199 A | 4/2009 |
| JP | 2009088243 A | 4/2009 |
| JP | 2011086713 A | 4/2011 |
| JP | 2015188093 A | 10/2015 |
| TW | 200914595 A | 4/2009 |
| TW | 201518488 A | 5/2015 |
| WO | 2009119178 A1 | 10/2009 |
| WO | 2015019706 A1 | 2/2015 |
| WO | 2016115153 A1 | 7/2016 |

OTHER PUBLICATIONS

English translation of Office Action issued in Chinese counterpart application No. 202080056791.3, mail date of Office Action Mar. 14, 2023.

* cited by examiner

*Primary Examiner* — Roberts P Culbert

(57) ABSTRACT

Provided is a chemical-mechanical polishing composition comprising an abrasive, a basic component, at least one compound selected from the group consisting of a quaternary polyammonium salt, a quaternary ammonium salt having 6 or more carbon atoms, and an alkylated polymer having an amide structure, and an aqueous carrier; a rinse composition comprising the at least one compound and an aqueous carrier, as well as a method of chemically-mechanically polishing a substrate, and a method of rinsing a substrate, in which the respective compositions are used.

22 Claims, No Drawings

CHEMICAL-MECHANICAL POLISHING COMPOSITION, RINSE COMPOSITION, CHEMICAL- MECHANICAL POLISHING METHOD, AND RINSING METHOD

FIELD

The present invention relates to a chemical-mechanical polishing composition and a rinse composition, as well as a method of chemically-mechanically polishing a substrate and a method of rinsing a substrate in which these compositions are used.

BACKGROUND

A substrate such as a silicon wafer used in the production of a semiconductor device has strict surface quality requirements. In order to ensure such surface quality, conventionally, a chemical-mechanical polishing (CMP) technology has been used. Generally, CMP for a substrate such as a silicon wafer is composed of a plurality of steps, and includes, for example, a preliminary polishing step and a finish polishing step.

In the preliminary polishing step, by polishing the surface of substrate with a polishing slurry having a relatively strong polishing power, the shape or the surface condition of the substrate can be prepared efficiently. On the other hand, in the finish polishing step, the surface quality of a substrate after the preliminary polishing step is improved generally using a polishing slurry having a weaker polishing power than in the preliminary polishing step.

A mark (hard laser mark) such as a bar code, a numeral, and a symbol may be sometimes given to a substrate such as a silicon wafer by irradiating the surface thereof with a laser beam for the purpose of identification or the like. Since the fringe of a hard laser mark is hardened due to alteration such as polysiliconization due to the energy of the laser beam, a protrusion may sometimes appear on the fringe of the hard laser mark in a preliminary polishing step, when a conventional general polishing composition is used. Since such a protrusion on the fringe of the hard laser mark reduces the flatness of the substrate, it may have a strong impact on the product yield of a semiconductor.

Patent Literature 1 describes a polishing composition which is used for polishing a silicon wafer, contains silica particles, a weak acid salt, and a quaternary ammonium compound, in which the BET average particle diameter of the silica particles is 50 nm or less, and the content Y [mol/L] of the quaternary ammonium compound in the polishing composition satisfies Formula (1), namely $0.80 \leq (Y/Y_0)$ (wherein $Y_0$ [mol/L] is the quantity defined by Formula (2), namely $Y_0 = AX + B$, where A is a theoretical buffer ratio between the quaternary ammonium compound and the weak acid salt, X [mol/L] is the content of the weak acid salt in the polishing composition, and B [mol/L] is the amount of such portion of the quaternary ammonium compound in the polishing composition as adsorbed on the silica particles). Further, Patent Literature 1 describes that a protrusion on the fringe of a hard laser mark can be eliminated efficiently by using the above polishing composition, because the pH fluctuation of the polishing composition in polishing can be suppressed favorably by effective utilization of the buffering action of the quaternary ammonium compound and the weak acid salt, so as to maintain favorably the polishing efficiency.

In the CMP of a substrate such as a silicon wafer, along with a recent increase in demand and the advancement of high performance and high integration of semiconductor devices, in addition to an improvement in productivity, an improvement in surface quality has been increasingly demanded. In particular, in order to realize high integration and high speed, such as in ultra-large-scale integrated circuits (ULSI) used for computers, refinement of design rules of semiconductor devices is progressing year by year. Additionally, the importance of managing nano-level surface defects, which has not been a problem in the past, is increasing.

A surface defect inspection device is generally used to manage surface defects on a substrate such as a silicon wafer. The defects detected by a surface defect inspection device include foreign matter and residue on a substrate which could not be removed by a polishing step or a subsequent rinsing step, etc. As such a surface defect inspection device, for example, a device which irradiates the substrate surface with light such as a laser beam, and detects the reflected light or scattered light from the substrate surface to detect a defect existing on the substrate surface has been commonly known.

Meanwhile, when a substrate surface is irradiated with such intense light, cloudiness may develop due to irregular reflection due to the roughness of the substrate surface. This cloudiness is referred to as haze, and the haze is closely related to the surface roughness of the substrate, and therefore can be used as a measure of the surface roughness. In recent years, owing to rapid progress of a surface defect inspection device, it has become possible to observe surface defects up to the nano level, however when the substrate surface is hazy, the defect detection by a surface defect inspection device may be hampered because diffused reflection light caused by the haze may generate background noises. Therefore, as the size of the surface defects to be managed becomes smaller, there is a growing need for decrease in haze level by reducing appropriately the surface roughness in a polishing step such as a preliminary polishing step or a finish polishing step.

Patent Literature 2 describes a method for polishing a silicon substrate including a preliminary polishing step for preliminarily polishing the silicon substrate, in which a first polishing slurry and a second polishing slurry are supplied in turn to the silicon substrate to be polished in the mentioned order in polishing the silicon substrate, wherein as the second polishing slurry, a slurry containing abrasive grains $A_2$, in which the volume average diameter ($M_v$) of the abrasive grains $A_2$ is smaller than the volume average diameter ($M_v$) of the abrasive grains $A_1$ contained in the first polishing slurry, and the ratio ($M_v/D_{BET}$) of the $M_v$ of the abrasive grains $A_2$ to the BET diameter ($D_{BET}$) of the abrasive grains $A_2$ is not more the ratio ($M_v/D_{BET}$) of the $M_v$ of the abrasive grains $A_1$ to the BET diameter ($D_{BET}$) of the abrasive grains $A_1$, is used. Further, Patent Literature 2 describes that by the preliminary polishing step where the first polishing slurry containing the abrasive grains $A_1$ and the second polishing slurry containing the abrasive grains $A_2$ having My which is smaller, and $M_v/D_{BET}$ which is not greater, than those of the abrasive grains $A_1$ are supplied in turn during polishing, elimination of a protrusion on the fringe of a hard laser mark, and reduction of the surface roughness can be both favorably achieved at the same time.

CITATION LIST

Patent Literature

[PTL 1] Japanese Unexamined Patent Publication (Kokai) No. 2015-233031

[PTL 2] Japanese Unexamined Patent Publication (Kokai) No. 2017-183359

SUMMARY

Technical Problem

Patent Literature 1 teaches the use of a quaternary ammonium compound as an added component capable of eliminating a protrusion on the fringe of a hard laser mark as described above. However, Patent Literature 1 discloses specifically solely tetramethylammonium hydroxide (TMAH) as the quaternary ammonium compound, and has not investigated adequately whether or not another quaternary ammonium compound can eliminate a protrusion on the fringe of a hard laser mark. Also, Patent Literature 1 has made no investigation on the effect of a quaternary ammonium compound on reduction of the surface roughness or the haze.

In Patent Literature 2, as described above, an investigation has been made whether or not both elimination of a protrusion on the fringe of a hard laser mark, and reduction of the surface roughness can be achieved in the preliminary polishing step by using two different kinds of abrasive grains from the viewpoints of parameters concerning volume average diameter and BET diameter. However, no thorough investigation has been made on an added component capable of eliminating a protrusion on the fringe of a hard laser mark, or reducing the surface roughness and hence the haze.

As mentioned earlier, it is very important to eliminate appropriately a protrusion on the fringe of a hard laser mark caused by providing the hard laser mark from the viewpoint of improvement of the flatness of a substrate and thus also improvement of the yield in producing semiconductors. Further, along with recent advancement of high performance and high integration of semiconductor devices, it has become more necessary to attain lower surface roughness of a substrate such as a silicon wafer so as to lower the haze level. Therefore, with respect to a polishing composition to be used in a polishing step such as a preliminary polishing step or a finish polishing step, or a rinse composition to be used in a rinsing step after the polishing step, an added component that is effective in reducing a protrusion on the fringe of the hard laser mark caused by providing the hard laser mark and/or reducing the haze has been demanded in the art, and there is a need for a polishing composition and a rinse composition containing such an added component.

Therefore, the object of the present invention is to provide a novel chemical-mechanical polishing composition, and rinse composition, which contain an added component useful for achieving at least one of reduction of a protrusion on the fringe of the hard laser mark, and reduction of the haze, as well as a method of chemically-mechanically polishing a substrate, and a method of rinsing a substrate using the respective compositions.

Solution to Problem

The present invention, which can achieve the aforementioned object, is as described below.

(1) A chemical-mechanical polishing composition, comprising:
an abrasive,
a basic component,
at least one compound selected from the group consisting of a quaternary polyammonium salt, a quaternary ammonium salt having 6 or more carbon atoms, and an alkylated polymer having an amide structure, and
an aqueous carrier.

(2) The chemical-mechanical polishing composition of (1) above, wherein the at least one compound comprises two or more of the quaternary polyammonium salt, the quaternary ammonium salt having 6 or more carbon atoms, and the alkylated polymer having an amide structure.

(3) The chemical-mechanical polishing composition of (1) or (2) above, wherein the at least one compound comprises the quaternary polyammonium salt, wherein the quaternary polyammonium salt has following general formula (1):

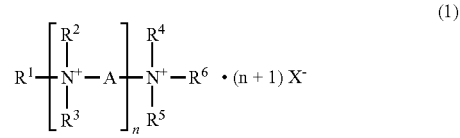

wherein $R^1$, $R^2$, $R^3$, $R^4$, $R^5$ and $R^6$ are independently a substituted or unsubstituted, linear or branched alkyl group having 1 to 6 carbon atoms, A is independently a substituted or unsubstituted, linear or branched alkylene group having 1 to 30 carbon atoms, n is an integer of 1 to 10, and X" is a counterion.

(4) The chemical-mechanical polishing composition of (3) above, wherein the quaternary polyammonium salt is a quaternary diammonium salt, and wherein in the general formula (1), A is a substituted or unsubstituted, linear or branched alkylene group having 1 to 15 carbon atoms, and n is 1.

(5) The chemical-mechanical polishing composition of (1) or (2) above, wherein the at least one compound comprises the quaternary ammonium salt having 6 or more carbon atoms, wherein the quaternary ammonium salt having 6 or more carbon atoms has following general formula (2):

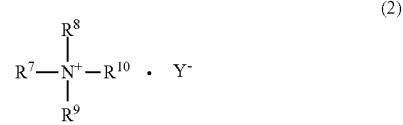

wherein $R^7$, $R^8$ and $R^9$ are independently a substituted or unsubstituted, linear or branched alkyl group having 1 to 6 carbon atoms, or a benzyl group, $R^{10}$ is a substituted or unsubstituted, linear or branched alkyl group having 2 to 30 carbon atoms, and Y" is a counterion.

(6) The chemical-mechanical polishing composition of (1) or (2) above, wherein the at least one compound comprises the alkylated polymer having an amide structure, wherein the alkylated polymer having an amide structure is an alkylated polyvinylpyrrolidone.

(7) The chemical-mechanical polishing composition of any one of (1) to (6) above, further comprising tetramethylammonium hydroxide.

(8) The chemical-mechanical polishing composition of any one of (1) to (7) above, further comprising a water-soluble polymer different from the alkylated polymer having an amide structure.

(9) The chemical-mechanical polishing composition of (8) above, wherein the water-soluble polymer comprises at least one selected from the group consisting of polyvinylpyrrolidone, polyvinylacetamide, a cellulose derivative, and a polymer containing a polyvinyl alcohol structural unit.

(10) A rinse composition, comprising:
at least one compound selected from the group consisting of a quaternary polyammonium salt, a quaternary ammonium salt having 6 or more carbon atoms, and an alkylated polymer having an amide structure, and
an aqueous carrier.

(11) The rinse composition of (10) above, wherein the at least one compound comprises two or more of the quaternary polyammonium salt, the quaternary ammonium salt having 6 or more carbon atoms, and the alkylated polymer having an amide structure.

(12) The rinse composition of (10) or (11) above, wherein the at least one compound comprises the quaternary polyammonium salt, wherein the quaternary polyammonium salt has following general formula (1):

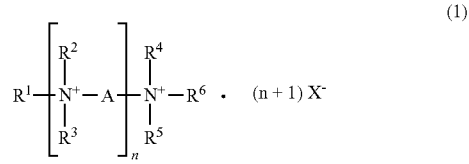

wherein $R^1$, $R^2$, $R^3$, $R^4$, $R^5$ and $R^6$ are independently a substituted or unsubstituted, linear or branched alkyl group having 1 to 6 carbon atoms, A is independently a substituted or unsubstituted, linear or branched alkylene group having 1 to 30 carbon atoms, n is an integer of 1 to 10, and X" is a counterion.

(13) The rinse composition of (12) above, wherein the quaternary polyammonium salt is a quaternary diammonium salt, and wherein in the general formula (1), A is a substituted or unsubstituted, linear or branched alkylene group having 1 to 15 carbon atoms, and n is 1.

(14) The rinse composition of (10) or (11) above, wherein the at least one compound comprises the quaternary ammonium salt having 6 or more carbon atoms, wherein the quaternary ammonium salt having 6 or more carbon atoms has following general formula (2):

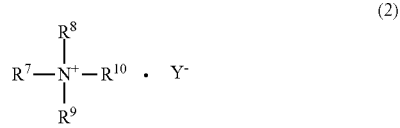

wherein $R^7$, $R^8$ and $R^9$ are independently a substituted or unsubstituted, linear or branched alkyl group having 1 to 6 carbon atoms, or a benzyl group, $R^{10}$ is a substituted or unsubstituted, linear or branched alkyl group having 2 to 30 carbon atoms, and Y" is a counterion.

(15) The rinse composition of (10) or (11) above, wherein the at least one compound comprises the alkylated polymer having an amide structure, wherein the alkylated polymer having an amide structure is an alkylated polyvinylpyrrolidone.

(16) The rinse composition of any one of (10) to (15) above, further comprising tetramethylammonium hydroxide.

(17) The rinse composition of any one of (10) to (16) above, further comprising a water-soluble polymer different from the alkylated polymer having an amide structure.

(18) The rinse composition of (17) above, wherein the water-soluble polymer comprises at least one selected from the group consisting of polyvinylpyrrolidone, polyvinylacetamide, a cellulose derivative, and a polymer containing a polyvinyl alcohol structural unit.

(19) A method of chemically-mechanically polishing a substrate, comprising:
contacting the substrate with a polishing pad and the chemical-mechanical polishing composition of any one of (1) to (9) above,
moving the polishing pad relative to the substrate with the chemical-mechanical polishing composition therebetween, and
abrading at least a portion of the substrate to polish the substrate.

(20) A method of rinsing a substrate, comprising:
contacting the substrate after chemically-mechanically polishing with a polishing pad and the rinse composition of any one of (10) to (18) above, and moving the polishing pad relative to the substrate with the rinse composition therebetween.

(21) A method of chemically-mechanically polishing a substrate using a polishing apparatus provided with an upper platen and lower platen each having a polishing pad adhered thereto, and a carrier plate having at least one holding hole for holding the substrate, comprising:
holding the substrate in the at least one holding hole of the carrier plate, then sandwiching the carrier plate between the upper platen and lower platen each having the polishing pad adhered thereto, and
rotating and revolving the carrier plate to simultaneously polish both sides of the substrate, while supplying the chemical-mechanical polishing composition of any one of (1) to (9) above to surfaces to be polished of the substrate.

(22) A method of rinsing a substrate using a polishing apparatus provided with an upper platen and lower platen each having a polishing pad adhered thereto, and a carrier plate having at least one holding hole for holding the substrate, comprising:
rotating and revolving the carrier plate, while supplying the rinse composition of any one of (10) to (18) above to surfaces to be polished of the substrate after chemically-mechanically polishing.

Advantageous Effects of Invention

According to the present invention, when at least one compound selected from the group consisting of a quaternary polyammonium salt, a quaternary ammonium salt having 6 or more carbon atoms, and an alkylated polymer having an amide structure, is used as an added component, a protrusion on the fringe of the hard laser mark may be reduced particularly in the preliminary polishing, and/or the haze of a substrate surface may be reduced in both preliminary polishing and finish polishing as compared with a case where the at least one compound is not used. Therefore, using a chemical-mechanical polishing composition of the present invention containing such an added component, through reduction of a protrusion on the fringe of the hard laser mark, it becomes possible to improve the flatness of the substrate, and thus also improve the yield in semiconductor production. Alternatively, or additionally, using a chemical-mechanical polishing composition of the present invention containing such an added component, through reduction of the haze of a substrate surface, it is possible to reduce the background noise during defect detection with a surface defect inspection device, whereby detection and management of micro surface defects, for example, nano-level surface defects using the surface defect inspection device, can be facilitated. Additionally, a chemical-mechanical polishing composition of the present invention can be effectively used for polishing a substrate such as a low resistivity silicon wafer.

DESCRIPTION OF EMBODIMENTS

<Chemical-Mechanical Polishing Composition>

A chemical-mechanical polishing composition of the present invention is characterized by comprising:
  an abrasive,
  a basic component,
  at least one compound selected from the group consisting of a quaternary polyammonium salt, a quaternary ammonium salt having 6 or more carbon atoms, and an alkylated polymer having an amide structure, and
  an aqueous carrier.

As described above, in connection with a hard laser mark (hereinafter, also referred to as "HLM") provided by irradiating the surface of a substrate such as a silicon wafer with a laser beam for the purpose of identification or the like, it is known that a protrusion is generated in a preliminary polishing step on the substrate surface in the fringe of the HLM. Appropriate removal of the protrusion is very important from the viewpoint of improving the flatness of the substrate and thus improving the yield in semiconductor production. Further, along with recent advancement of high performance and high integration of semiconductor devices, it has become important to manage nano-level surface defects that have not been a problem in the past, and in this context it has become more necessary to attain lower surface roughness of a substrate such as a silicon wafer so as to lower the haze level.

Therefore, the present inventors have investigated added components in a chemical-mechanical polishing composition and a rinse composition useful for achieving at least one, preferably both of reduction of the protrusion on the HLM fringe due to provision of the HLM, and reduction of the haze of the substrate surface. As a result, the present inventors have found that by using at least one compound selected from the group consisting of a quaternary polyammonium salt, a quaternary ammonium salt having 6 or more carbon atoms, and an alkylated polymer having an amide structure as such an added component, the protrusion on the HLM fringe can be reduced particularly in preliminary polishing, and/or the haze of a substrate surface can be reduced in both preliminary polishing and finish polishing as compared with the case where the at least one compound is not used. In addition, the present inventors have found that when the at least one compound is used, the polishing speed can be improved compared to a case where the at least one compound is not used, even with respect to a substrate such as a low resistivity silicon wafer for which it is generally known that chemical-mechanical polishing is difficult, and further the haze and surface defects can be reduced.

Therefore, using a chemical-mechanical polishing composition of the present invention containing such an added component, through reduction of a protrusion on the HLM fringe, it becomes possible to improve the flatness of the substrate, and thus also improve the yield in semiconductor production. Alternatively, or additionally, using a chemical-mechanical polishing composition of the present invention containing such an added component, through reduction of the haze of a substrate surface, it is possible to reduce the background noise during defect detection with a surface defect inspection device, whereby detection and management of micro surface defects, for example, nano-level surface defects using the surface defect inspection device, can be facilitated. Furthermore, according to the present invention, the above added components can achieve the same effect not only when used in a chemical-mechanical polishing composition, but also in a rinse composition. In addition, a chemical-mechanical polishing composition of the present invention can be effectively used in polishing a substrate such as a low resistivity silicon wafer.

[Abrasive]

The abrasive of the present invention may be any suitable abrasive which is known to a person skilled in the art in the chemical-mechanical polishing of semiconductor substrates such as silicon wafers. The abrasive may be, for example, an abrasive selected from the group consisting of alumina (e.g., α-alumina, γ-alumina, δ-alumina, and fumed alumina), silica (e.g., colloidal silica, precipitated silica, and fumed silica), ceria, titania, zirconia, germania, magnesia, co-formed products thereof, and any combinations thereof, though the abrasive is not limited thereto. The abrasive is preferably selected from the group consisting of alumina, silica, ceria, zirconia, and combinations thereof, more preferably silica, in particular colloidal silica or ceria, and particularly preferably colloidal silica.

In the present invention, the abrasive can have any suitable particle size. For example, the abrasive can have an average primary particle size of 0.01 μm or more, 0.015 μm or more, 0.02 μm or more, or 0.025 μm or more, and 3 μm or less, 1.5 μm or less, 0.8 μm or less, 0.5 μm or less, or 0.1 μm or less, though the particle size of the abrasive is not limited thereto. From the viewpoint of improving the substrate polishing speed, the abrasive preferably has an average primary particle size in the range of 0.01 to 1.5 μm, more preferably 0.01 to 0.5 μm, and especially preferably 0.01 to 0.1 μm. Further, when the primary particles aggregate to form secondary particles, from the viewpoint of increasing polishing speed and reducing surface roughness of a substrate to be polished, the abrasive preferably has an average secondary particles size in the range of 0.02 to 3 μm, more preferably 0.02 to 1.0 μm, and especially preferably 0.02 to 0.2 μm. The average primary particle size of the abrasive can be determined by performing image analysis on an image captured with a scanning electron microscope (SEM) or transmission electron microscope (TEM). Furthermore, the average secondary particle size can be measured as a volume average particle size using a dynamic light scattering method.

The abrasive may be present in the chemical-mechanical polishing composition in a quantity of, for example, 0.01% by mass or more, 0.02% by mass or more, 0.05% by mass or more, 0.1% by mass or more, or 0.5% by mass or more, and 50% by mass or less, 20% by mass or less, 15% by mass or less, 12% by mass or less, or 10% by mass or less based on the mass of the aqueous carrier and all of the components dissolved or suspended therein. The abrasive may be preferably present in the chemical-mechanical polishing composition in a quantity in the range of 0.01 to 30% by mass, more preferably 0.05 to 20% by mass, and especially preferably 0.1 to 10% by mass.

[Basic Component]

The basic component of the present invention may be an optional component which can act chemically on the surface of a semiconductor substrate such as a silicon wafer to assist mechanical polishing with an abrasive. Though not particularly limited, the basic component may be, for example, a compound selected from the group consisting of ammonia, potassium hydroxide, sodium hydroxide, ammonium carbonate, potassium carbonate, sodium carbonate, methylamine, dimethylamine, trimethylamine, ethylamine, diethylamine, triethylamine, ethylenediamine, monoethanolamine, N-(β-aminoethyl) ethanolamine, hexamethylenediamine, diethylenetriamine, triethylenetetramine, tetraethylenepentamine, anhydrous piperazine, piperazine hexahydrate, 1-(2-aminoethyl) piperazine, N-methylpiperazine, and any combinations thereof. The basic component is preferably selected from the group consisting of ammonia, potassium hydroxide, sodium hydroxide, ammonium carbonate, potassium carbonate, and sodium carbonate. More preferably the basic component is ammonia, potassium hydroxide, or sodium hydroxide, and especially preferably potassium hydroxide.

The basic component may be present in a chemical-mechanical polishing composition in a quantity of, for example, 0.001% by mass or more, 0.002% by mass or more, 0.005% by mass or more, 0.01% by mass or more, or 0.1% by mass or more, and 5.0% by mass or less, 3.0% by mass or less, 1.5% by mass or less, 1.2% by mass or less, or 1.0% by mass or less based on the mass of the aqueous carrier and all of the components which are dissolved or suspended therein. The basic component may be preferably present in a chemical-mechanical polishing composition in a quantity in the range of 0.001 to 5.0% by mass, more preferably 0.005 to 1.5% by mass, and especially preferably 0.01 to 1.0% by mass.

[Additional Components]

A chemical-mechanical polishing composition of the present invention contains at least one compound selected from the group consisting of a quaternary polyammonium salt, a quaternary ammonium salt having 6 or more carbon atoms, and an alkylated polymer having an amide structure. The at least one compound may contain two or more kinds out of a quaternary polyammonium salt, a quaternary ammonium salt having 6 or more carbon atoms, and an alkylated polymer having an amide structure. When these compounds are contained as an added component singly or in combination of two or more kinds thereof, as compared with the case where such compound is not used, protrusion on the HLM fringe can be reduced particularly in preliminary polishing, and/or the haze of a substrate surface can be reduced in both preliminary polishing and finish polishing.

Further, it has been known that chemical-mechanical polishing on a substrate such as a low resistivity silicon wafer having a resistivity less than 1 Ω·cm, particularly less than 0.010 Ω·cm, or less than 0.002 Ω·cm is generally difficult due to difficulty in etching the substrate. However, according to the present invention, by using at least one compound selected from the group consisting of a quaternary polyammonium salt, a quaternary ammonium salt having 6 or more carbon atoms, and an alkylated polymer having an amide structure, it is possible to improve the polishing speed and to reduce the haze and surface defects not only with respect to a general substrate having a resistivity of 1 Ω·cm or more, but even to a low resistivity substrate having a resistivity of less than 0.002 Ω·cm. Further, according to the present invention, by using the at least one compound, it is possible to achieve a significantly better polishing speed compared to a case where an amine compound such as triethylenetetramine generally known as an additive for improving the polishing speed is used, or a case where the amount of an abrasive is increased.

The Content of the at least one compound (in a case where the at least one compound is a combination of two or more compounds, the total content thereof) may be also, for example, 0.001% by mass or more, 0.002% by mass or more, 0.005% by mass or more, 0.01% by mass or more, or 0.1% by mass or more, and 10.0% by mass or less, 5.0% by mass or less, 3.0% by mass or less, 1.0% by mass or less, or 0.5% by mass or less based on the mass of the aqueous carrier and all components that are dissolved or suspended therein. The Content of the at least one compound may be preferably 0.001 to 10.0% by mass, more preferably 0.005 to 5.0% by mass, and particularly preferably 0.01 to 3.0% by mass.

[Quaternary Polyammonium Salt]

The quaternary polyammonium salt may be expressed by, but without particular limitation, the following general formula (1):

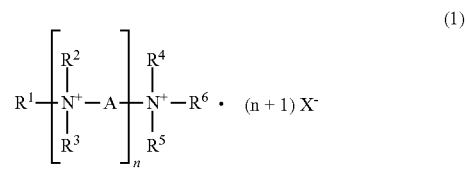

wherein $R^1$, $R^2$, $R^3$, $R^4$, $R^5$, and $R^6$ are independently a substituted or unsubstituted, linear or branched alkyl group having 1 to 6 carbon atoms, A is independently a substituted or unsubstituted, linear or branched alkylene group having 1 to 30 carbon atoms, n is an integer of 1 to 10, and X" is a counterion.

$R^1$, $R^2$, $R^3$, $R^4$, $R^5$, and $R^6$ in the general formula (1) may be, for example, independently a substituted or unsubstituted methyl group, ethyl group, n-propyl group, isopropyl group, n-butyl group, isobutyl group, sec-butyl group, tert-butyl group, n-pentyl group, isopentyl group, sec-pentyl group, tert-pentyl group, neopentyl group, n-hexyl group, isohexyl group, sec-hexyl group, or tert-hexyl group, and they are preferably a substituted or unsubstituted methyl group, ethyl group, or n-propyl group. $R^1$, $R^2$, $R^3$, $R^4$, $R^5$, and $R^6$ may be substituted, for example, with a halogen atom (e.g., fluorine atom, chlorine atom, bromine atom, or iodine atom), a hydroxyl group, an amino group, an alkylamino group (e.g., methylamino group, or ethylamino group), a dialkylamino group (e.g., dimethylamino group, or diethylamino group), or may be unsubstituted. For example, in a specific embodiment of the present invention $R^1$ and $R^6$ are a methyl group, an ethyl group, or a n-propyl group, and these groups are optionally substituted with a halogen atom, a hydroxyl group, and/or a dimethylamino group, meanwhile, $R^2$, $R^3$, $R^4$, and $R^5$ are each an unsubstituted methyl group.

A in the general formula (1) may be an optional linear or branched alkylene group having 1 to 30 carbon atoms, and the alkylene group may be substituted, for example, with a halogen atom (e.g., fluorine atom, chlorine atom, bromine atom, or iodine atom), a hydroxyl group, an amino group, a methylamino group, or a dimethylamino group, or may be unsubstituted. Although the carbon number may be appropriately decided within a range of 1 to 30, the carbon number is preferably an integer of 3 to 30, more preferably 5 to 30, and particularly preferably 10 to 30 because a quaternary polyammonium salt having a larger cation moiety is believed to be effective in reducing a protrusion on the HLM fringe. For example, in a specific embodiment of the present invention, A is a linear alkylene group having 5 to 20 carbon atoms, and it may be optionally substituted with a halogen atom or a hydroxyl group.

Meanwhile, when a quaternary polyammonium salt having a higher degree of polymerization is used, an abrasive such as silica contained in the composition may be aggregated. In such a case, there is a risk that the obtained composition cannot be used in chemical-mechanical polishing, or the polishing performance of the obtained composition is significantly lowered. Therefore, n in the general formula (1) is generally an integer of 1 to 100, preferably 1 to 50, more preferably 1 to 10, and particularly preferably 1 to 3. According to the present invention, the quaternary polyammonium salt can have any suitable molecular weight. The quaternary polyammonium salt can generally have an average molecular weight of about 15,000 or less, for example, 7,500 or less, or 1,500 or less, but without any particular limitation thereto.

X" in the general formula (1) may be any suitable counterion, and may be, for example, one selected from the group consisting of a hydroxide ion, a halide ion (e.g., fluoride ion, chloride ion, bromide ion, or iodide ion), a nitrate ion, a hydrogen sulfate ion, a sulfamate ion, a cyanide ion, and a thiocyanate ion, but without any particular limitation thereto. Preferably X" is selected from the group consisting of a hydroxide ion, and a halide ion, especially a chloride ion, and a bromide ion.

Although there is no particular restriction on a more specific example of the aforementioned quaternary polyammonium salt, examples thereof include a quaternary diammonium salt, in which A in the general formula (1) is a substituted or unsubstituted, linear or branched alkylene group having 1 to 30 carbon atoms, preferably 1 to 15 carbon atoms, and n is 1, namely a quaternary diammonium salt expressed by the following general formula (Ia). $R^1$, $R^2$, $R^3$, $R^4$, $R^5$, $R^6$ and X" in the general formula (Ia) are the same as the above descriptions in relation to the general formula (1).

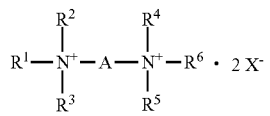

(Ia)

Specific examples of the cation moiety constituting the quaternary diammonium salt include, but not limited to, a methylenebis(trimethylammonium) ion, a methylenebis(ethyldimethylammonium) ion, a methylenebis(dimethylpropylammonium) ion, a methylenebis(triethylammonium) ion, an ethylenebis(trimethylammonium) ion, an ethylenebis(ethyldimethylammonium) ion, an ethylenebis(dimethylpropylammonium) ion, an ethylenebis(triethylammonium) ion, a trimethylenebis(trimethylammonium) ion, a trimethylenebis(ethyldimethylammonium) ion, a trimethylenebis(dimethylpropylammonium) ion, a trimethylenebis(triethylammonium) ion, a tetramethylenebis(trimethylammonium) ion, a tetramethylenebis(ethyldimethylammonium) ion, a tetramethylenebis(dimethylpropylammonium) ion, a tetramethylenebis(triethylammonium) ion, a pentamethylenebis(trimethylammonium) ion, a pentamethylenebis(ethyldimethylammonium) ion, a pentamethylenebis(dimethylpropylammonium) ion, a pentamethylenebis(triethylammonium) ion, a hexamethylenebis(trimethylammonium) ion, a hexamethylenebis(ethyldimethylammonium) ion, hexamethylenebis(dimethylpropylammonium) ion, a hexamethylenebis(triethylammonium) ion, a heptamethylenebis(trimethylammonium) ion, a heptamethylenebis(ethyldimethylammonium) ion, a heptamethylenebis(dimethylpropylammonium) ion, a heptamethylenebis(triethylammonium) ion, an octamethylenebis(trimethylammonium) ion, an octamethylenebis(ethyldimethylammonium) ion, an octamethylenebis(dimethylpropylammonium) ion, an octamethylenebis(triethylammonium) ion, a nonamethylenebis(trimethylammonium) ion, a nonamethylenebis(ethyldimethylammonium) ion, a nonamethylenebis(dimethylpropylammonium) ion, a nonamethylenebis(triethylammonium ion, a decamethylenebis(trimethylammonium) ion, a decamethylenebis(ethyldimethylammonium) ion, a decamethylenebis(dimethylpropylammonium) ion, a decamethylenebis(triethylammonium) ion, an undecamethylenebis(trimethylammonium) ion, an undecamethylenebis(ethyldimethylammonium) ion, an undecamethylenebis(dimethylpropylammonium) ion, an undecamethylenebis(triethylammonium) ion, an dodecamethylenebis(trimethylammonium) ion, a dodecamethylenebis(ethyldimethylammonium) ion, a dodecamethylenebis(dimethylpropylammonium) ion, a dodecamethylenebis(triethylammonium) ion, a tridecamethylenebis(trimethylammonium) ion, a tridecamethylenebis(ethyldimethylammonium) ion, a tridecamethylenebis(dimethylpropylammonium) ion, a tridecamethylenebis(triethylammonium) ion, a tetradecamethylenebis(trimethylammonium) ion, a tetradecamethylenebis(ethyldimethylammonium) ion, a tetradecamethylenebis(dimethylpropylammonium) ion, a tetradecamethylenebis(triethylammonium) ion, a pentadecamethylenebis(trimethylammonium) ion, a pentadecamethylenebis(ethyldimethylammonium) ion, a pentadecamethylenebis(dimethylpropylammonium) ion, and a pentadecamethylenebis(triethylammonium) ion.

In a specific embodiment of the present invention, the quaternary diammonium salt is a halide containing the above hexamethylenebis(trimethylammonium) ion, decamethylenebis(trimethylammonium) ion, or the like, more specifically hexamethylenebis(trimethylammonium chloride), or decamethylenebis(trimethylammonium bromide).

Further, the alkyl group in the cation moiety described above may be substituted with a halogen atom (e.g., fluorine atom, chlorine atom, bromine atom, or iodine atom), a hydroxyl group, an amino group, an alkylamino group (e.g., methylamino group, or ethylamino group), a dialkylamino group (e.g., dimethylamino group, or diethylamino group), or the like, or may be unsubstituted. For example, a quaternary diammonium salt containing the hexamethylenebis(dimethylpropylammonium) ion exemplified above may be a halide in which a propyl group bonded to a nitrogen atom is substituted with a chlorine atom or a hydroxyl group as shown in the following formula (Ib):

(1b)

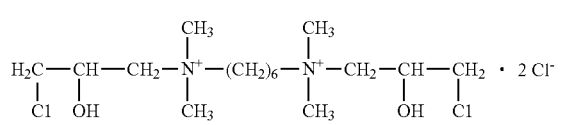

Other more specific examples of the quaternary polyammonium salt include, but not particularly limited to, a quaternary polyammonium salt having a dimethylamino group at the terminal and expressed by the following general formula (Ic):

(Ic)

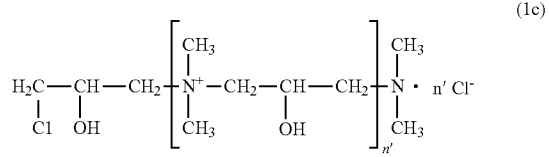

(wherein n' is an integer of 2 to 11). This quaternary polyammonium salt corresponds to a compound in which $R^1$ in the general formula (1) is a n-propyl group substituted with a chlorine atom and a hydroxyl group, $R^2$, $R^3$, $R^4$, and $R^5$ are methyl groups, and $R^6$ is a n-propyl group substituted with a hydroxyl group, and with a dimethylamino group at the terminal, A is a n-propylene group substituted with a hydroxyl group, and X" is Cl". Compounds expressed by any of the above general formulas (1), and (1a) to (1c) as well as the compounds specifically described in relation to these general formulas may be synthesized by any method known to a person skilled in the art, or may be commercially available.

[Quaternary Ammonium Salt Having 6 or More Carbon Atoms]

The quaternary ammonium salt having 6 or more carbon atoms may be for example one expressed by the following general formula (2) but without limitation thereto:

(2)

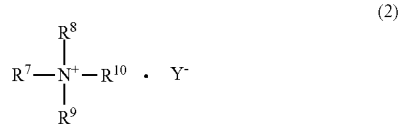

wherein $R^7$, $R^8$, and $R^9$ are independently a substituted or unsubstituted, linear or branched alkyl group having 1 to 6 carbon atoms, or a benzyl group, and preferably $R^7$, $R^8$, and $R^9$ are methyl groups, or $R^7$ and $R^8$ are methyl groups and $R^9$ is a benzyl group, and $R^{10}$ is a substituted or unsubstituted, linear or branched alkyl group having 2 to 30 carbon atoms, and preferably an unsubstituted linear or branched alkyl group having 2 to 30 carbon atoms, and Y" is a counterion, and preferably a halide ion.

$R^7$, $R^8$, and $R^9$ in the general formula (2) may be independently a substituted or unsubstituted methyl group, ethyl group, n-propyl group, isopropyl group, n-butyl group, isobutyl group, sec-butyl group, tert-butyl group, n-pentyl group, isopentyl group, sec-pentyl group, tert-pentyl group, neopentyl group, n-hexyl group, isohexyl group, sec-hexyl group, tert-hexyl group, or benzyl group. $R^7$, $R^8$, and $R^9$ may be substituted for example with a halogen atom (e.g., fluorine atom, chlorine atom, bromine atom, or iodine atom), a hydroxyl group, an amino group, an alkylamino group (e.g., methylamino group, or ethylamino group), or a dialkylamino group, (e.g., dimethylamino group, or diethylamino group); or may be unsubstituted. In a specific embodiment of the present invention $R^7$, $R^8$, and $R^9$ are a methyl group, an ethyl group, a n-propyl group, a n-butyl group, or a benzyl group, and these groups may be substituted with a halogen atom, a hydroxyl group, or the like.

$R^{10}$ in the general formula (2) may be an optional linear or branched alkyl group having 2 to 30 carbon atoms, and the alkyl group may be for example substituted with a halogen atom (e.g., fluorine atom, chlorine atom, bromine atom, or iodine atom), a hydroxyl group, an amino group, an alkylamino group (e.g., methylamino group, or ethylamino group), a dialkylamino group (e.g., dimethylamino group, or diethylamino group) or the like; or may be unsubstituted. More specific examples of $R^{10}$ include a substituted or unsubstituted ethyl group, n-propyl group, isopropyl group, n-butyl group, isobutyl group, sec-butyl group, tert-butyl group, n-pentyl group, isopentyl group, sec-pentyl group, tert-pentyl group, neopentyl group, n-hexyl group, isohexyl group, sec-hexyl group, tert-hexyl group, n-heptyl group, isoheptyl group, sec-heptyl group, tert-heptyl group, n-octyl group, isooctyl group, sec-octyl group, tert-octyl group, n-nonyl group, isononyl group, sec-nonyl group, tert-nonyl group, n-decyl group, isodecyl group, sec-decyl group, tert-decyl group, n-undecyl group, isoundecyl group, sec-undecyl group, tert-undecyl group, neoundecyl group, n-dodecyl group, isododecyl group, sec-dodecyl group, tert-dodecyl group, neododecyl group, n-tridecyl group, isotridecyl group, sec-tridecyl group, tert-tridecyl group, neotridecyl group, n-tetradecyl group, isotetradecyl group, sec-tetradecyl group, tert-tetradecyl group, neotetradecyl group, 1-isobutyl-4-ethyloctyl group, n-pentadecyl group, isopentadecyl group, sec-pentadecyl group, tert-pentadecyl group, neopentadecyl group, n-hexadecyl group, isohexadecyl group, sec-hexadecyl group, tert-hexadecyl group, neohexadecyl group, 1-methylpentadecyl group, n-heptadecyl group, isoheptadecyl group, sec-heptadecyl group, tert-heptadecyl group, neoheptadecyl group, n-octadecyl group, isooctadecyl group, sec-octadecyl group, tert-octadecyl group, neooctadecyl group, n-nonadecyl group, isononadecyl group, sec-nonadecyl group, tert-nonadecyl group, neononadecyl group, 1-methyloctyl group, n-icosyl group, isoicosyl group, sec-icosyl group, tert-icosyl group, and neoicosyl group. In a specific embodiment of the present invention, $R^{10}$ is an ethyl group, a n-propyl group, a n-butyl group, or a linear alkyl group having 8 to 18 carbon atoms, and these groups may be substituted with a halogen atom, a hydroxyl group, or the like.

A quaternary ammonium salt having a larger cation moiety is believed to be effective in reducing a protrusion on the HLM fringe. Therefore, from the viewpoint of reducing the protrusion on the HLM fringe, each of $R^7$ to $R^9$ is preferably a relatively long or bulky alkyl group, for example, a linear or branched alkyl group having 3 or more carbon atoms, particularly 4 or more carbon atoms. Alternatively or additionally, for the same reason, $R^{10}$ is preferably a long-chain or bulky alkyl group, for example, a linear or branched alkyl group having 7 or more carbon atoms, particularly 8 or more carbon atoms. Also, from the viewpoint of reducing the protrusion on the HLM fringe, the total carbon number of $R^7$ to $R^{10}$ is preferably 10 or more, and more preferably 15 or more. Meanwhile, there is no particular restriction on the upper limit of the carbon number, and generally it may be 50 or less, for example 45 or less, or 40 or less.

Y" in the general formula (2) may be an optional favorable counterion, and is not particularly limited. For example, it may be selected from the group consisting of a hydroxide ion, a halide ion (e.g., fluoride ion, chloride ion, bromide ion, or iodide ion), a nitrate ion, a hydrogensulfate ion, a sulfamate ion, a cyanide ion, and a thiocyanate ion. X" is preferably selected from the group consisting of a hydroxide ion, and a halide ion, especially a chloride ion, and a bromide ion.

There is no particular restriction on specific examples of a cation moiety constituting the quaternary ammonium salt having 6 or more carbon atoms, and examples thereof include a tetraethylammonium ion, a tetrapropylammonium ion, a tetrabutylammonium ion, a tetrapentylammonium ion, a tetrahexylammonium ion, a methyltriethylammonium ion, a methyltripropylammonium ion, a methyltributylammonium ion, a methyltripentylammonium ion, a methyltrihexylammonium ion, an ethyltripropylammonium ion, an ethyltributylammonium ion, an ethyltripentylammonium ion, an ethyltrihexylammonium ion, a diethyldimethylammonium ion, a propyltrimethylammonium ion, a propyltriethylammonium ion, a propyltributylammonium ion, a propyltripentylammonium ion, a propyltrihexylammonium ion, a dipropyldimethylammonium ion, a dipropyldiethylammonium ion, a butyltrimethylammonium ion, a butyltriethylammonium ion, a butyltripropylammonium ion, a butyltripentylammonium ion, a butyltrihexylammonium ion, a dibutyldimethylammonium ion, a dibutyldiethylammonium ion, a dibutyldipropylammonium ion, a pentyltrimethylammonium ion, a pentyltriethylammonium ion, a pentyltripropylammonium ion, a pentyltributylammonium ion, a pentyltrihexylammonium ion, a dipentyldimethylammonium ion, a dipentyldiethylammonium ion, a dipentyldipropylammonium ion, a dipentyldibutylammonium ion, a hexyltrimethylammonium ion, a hexyltriethylammonium ion, a hexyltripropylammonium ion, a hexyltributylammonium ion, a hexyltripentylammonium ion, a dihexyldimethylammonium ion, a dihexyldiethylammonium ion, a dihexyldipropylammonium ion, a dihexyldibutylammonium ion, a dihexyldipentylammonium ion, a heptyltrimethylammonium ion, a heptyltriethylammonium ion, a heptyltripropylammonium ion, a heptyltributylammonium ion, an octyltrimethylammonium ion, an octyltriethylammonium ion, an octyltripropylammonium ion, an octyltributylammonium ion, a nonyltrimethylammonium ion, a nonyltriethylammonium ion, a nonyltripropylammonium ion, a nonyltributylammonium ion, a decyltrimethylammonium ion, an undecyltrimethylammonium ion, a dodecyltrimethylammonium ion, a tridecyltrimethylammonium ion, a tetradecyltrimethylammonium ion, a pentadecyltrimethylammonium ion, a hexadecyltrimethylammonium ion, a heptadecyltrimethylammonium ion, an octadecyltrimethylammonium ion, a nonadecyltrimethylammonium ion, an icosyltrimethylammonium ion, a benzylethyldimethylammonium ion, a benzyltriethylammonium ion, a benzyltripropylammonium ion, a benzyltributylammonium ion, a benzyltripentylammonium ion, a benzyltrihexylammonium ion, and a benzalkonium ion.

In a specific embodiment of the present invention, the quaternary ammonium salt having 6 or more carbon atoms is a hydroxide or a halide containing a tetraethylammonium ion, a tetrabutylammonium ion, an octyltrimethylammonium ion, a hexadecyltrimethylammonium ion, a benzalkonium ion or the like, and is more specifically tetraethylammonium hydroxide, tetraethylammonium chloride, tetrabutylammonium hydroxide, octyltrimethylammonium chloride, hexadecyltrimethylammonium chloride, or benzalkonium chloride. Compounds expressed by the above general formula (2) and the compounds specifically described in relation to the general formulas may be synthesized by any method known to a person skilled in the art, or may be commercially available.

[Alkylated Polymer Having Amide Structure]

The alkylated polymer having an amide structure includes, for example, an optional copolymer of a compound having an amide structure and an unsaturated hydrocarbon having at least one double bond. There is no particular restriction on the molar ratio of the compound having an amide structure to the unsaturated hydrocarbon having at least one double bond, insofar as it is optionally selected within an appropriate range, however it is generally from 99:1 to 50:50, and may be, for example, from 95:5 to 70:30, or from 95:5 to 80:20. Specific examples of the compound having an amide structure include, but not limited to, N-vinylpyrrolidone, acryloylmorpholine, dimethylacrylamide, N-vinylacetamide, and derivatives thereof. The compound having an amide structure is preferably a compound having a cyclic amide structure, and specific examples thereof include N-vinylpyrrolidone and its derivatives, such as N-vinyl-3-methylpyrrolidone, N-vinyl-5-methylpyrrolidone, N-vinyl-3,3,5-trimethylpyrrolidone, and N-vinyl-3-benzylpyrrolidone. Specific examples of the unsaturated hydrocarbon having at least one double bond include, but not limited to, an unsaturated hydrocarbon having 2 or more carbon atoms, generally 2 to 10 carbon atoms, such as ethylene, propylene, butene (1-butene, cis-2-butene, trans-2-butene, or isobutene), and pentene (1-pentene, cis-2-pentene, trans-2-pentene, 2-methyl-1-butene, 2-methyl-2-butene, or 3-methyl-1-butene).

According to the present invention, the alkylated polymer having an amide structure may have any suitable molecular weight. Without particular limitation, the alkylated polymer having an amide structure may have, for example, an average molecular weight of about 500 to about 1,000,000.

In a specific embodiment of the present invention, the alkylated polymer having an amide structure is an alkylated polyvinylpyrrolidone, and more specifically a butylated polyvinylpyrrolidone (butylated PVP) which is a copolymer of N-vinylpyrrolidone and butene, especially 1-butene. The alkylated polymer having an amide structure and the compounds specifically described in relation thereto may be synthesized by any method known to a person skilled in the art, or may be commercially available.

[Aqueous Carrier]

The aqueous carrier is used to facilitate the application of all of the components which are dissolved or suspended in the aqueous carrier to a suitable substrate surface to be polished. The aqueous carrier may typically be composed of only water, may include water and a water-soluble solvent, or may be an emulsion. An alcohol such as, for example, methanol or ethanol, is preferably used as the water-soluble solvent. The aqueous carrier is preferably water, and more preferably deionized water.

The chemical-mechanical polishing composition of the present invention can have any suitable pH, and the specific pH value may be appropriately determined in consideration of polishing speed and the like. For example, the chemical-mechanical polishing composition can have a pH of 7 to 12, and preferably has a pH of 8 to 12, and more preferably 8.5 to 12. The pH value can be adjusted by adding a pH adjusting agent as necessary. The pH adjusting agent may be an optional alkaline substance, and may be the same as or different from the above basic component. The pH adjusting agent is preferably selected from the group consisting of ammonia, potassium hydroxide, sodium hydroxide, ammonium carbonate, potassium carbonate, and sodium carbonate. More preferably, the pH adjuster is ammonia, potassium hydroxide, or sodium hydroxide, and particularly preferably ammonia.

The chemical-mechanical polishing composition of the present invention may optionally include a pH buffer agent. Preferably, the pH buffer agent is selected from the group consisting of ammonium hydrogen carbonate, potassium hydrogen carbonate, and sodium hydrogen carbonate. More preferably, the pH adjustor is potassium hydrogen carbonate, or sodium hydrogen carbonate.

[Additional Added Component]

The chemical-mechanical polishing composition of the present invention may optionally further include tetramethylammonium hydroxide. By further adding tetramethylammonium hydroxide, it is possible to improve the polishing speed of a substrate.

Tetramethylammonium hydroxide may be present in a chemical-mechanical polishing composition, for example, in a quantity of 0.001% by mass or more, 0.002% by mass or more, 0.005% by mass or more, 0.01% by mass or more, or 0.1% by mass or more, and 10.0% by mass or less, 5.0% by mass or less, 3.0% by mass or less, 1.0% by mass or less, or 0.5% by mass or less based on the mass of the aqueous carrier and all the components dissolved or suspended therein. Tetramethylammonium hydroxide is preferably present in a chemical-mechanical polishing composition in a quantity in a range of 0.001 to 10.0% by mass, more preferably 0.005 to 5.0% by mass, and particularly preferably 0.01 to 3.0% by mass.

[Water-Soluble Polymer]

The chemical-mechanical polishing composition of the present invention may optionally further include a water-soluble polymer which is different from the aforementioned alkylated polymer having an amide structure. Examples of such a water-soluble polymer include, but not particularly limited thereto, at least one selected from the group consisting of polyvinylpyrrolidone (PVP), polyvinylacetamide, a cellulose derivative, and a polymer having a polyvinyl alcohol structural unit. In particular, in a case where polyvinylpyrrolidone and/or polyvinylacetamide is further added to the chemical-mechanical polishing composition of the present invention, it becomes possible to achieve better reduction effect on the haze compared to a case where the same is not added. Further, by adding polyvinylpyrrolidone and/or polyvinylacetamide, it becomes also possible to reduce formation of defects on the substrate surface. Therefore, the composition containing the water-soluble polymer may be used effectively not only in a preliminary polishing step, but also in a rinse or a finish polishing step after the preliminary polishing step. Polyvinylpyrrolidone and polyvinylacetamide may have any suitable molecular weight. The average molecular weight of polyvinylpyrrolidone or polyvinylacetamide may be, but not limited to, about 500 to about 1,000,000.

In a preferable specific embodiment of the present invention, the water-soluble polymer includes a cellulose derivative and/or a polymer including a polyvinyl alcohol structural unit in addition to polyvinylpyrrolidone and/or polyvinylacetamide. Each of the cellulose derivative and the polymer including a polyvinyl alcohol structural unit will be described in detail below.

(Cellulose Derivative)

The optional cellulose derivative acts primarily as a wetting agent in the chemical-mechanical polishing composition of the present invention. Such a wetting agent is effective for maintaining the hydrophilicity of the surface of a substrate such as a silicon wafer. In the present invention, the cellulose derivative can be selected from, for example, methylcellulose, hydroxyethyl cellulose, hydroxypropyl cellulose, hydroxypropyl methylcellulose, and any combinations thereof, and the cellulose derivative is preferably hydroxyethyl cellulose. The cellulose derivative can have an average molecular weight of 50,000 to 2,000,000.

The cellulose derivative may be present in the chemical-mechanical polishing composition in a quantity of, for example, 0.001% by mass or more, 0.002% by mass or more, 0.005% by mass or more, or 0.01% by mass or more, and 2.0% by mass or less, 1.5% by mass or less, 1.2% by mass or less, or 1.0% by mass or less based on the mass of the aqueous carrier and all of the components which are dissolved or suspended therein. The cellulose derivative may be preferably present in the chemical-mechanical polishing composition in a quantity in the range of 0.001 to 2.0% by mass, more preferably 0.005 to 1.5% by mass, and especially preferably 0.01 to 1.0% by mass.

(Polymer Containing Polyvinyl Alcohol Structural Units)

In chemical-mechanical polishing, since it takes advantage of the mechanical interaction between the substrate and the polishing composition (slurry), continuous surface defects such as nanoscratches and PID may occur on the substrate during polishing due to the abrasive contained in the slurry and/or other particles aggregated in the slurry, etc. In the present invention, in order to reduce continuous surface defects on the substrate such as nanoscratches and PID, the chemical-mechanical polishing composition can include a polymer containing polyvinyl alcohol structural units.

The polymer containing polyvinyl alcohol structural units can also act as a wetting agent. Thus, in the chemical-mechanical polishing composition of the present invention, in order to maintain hydrophilicity of substrate surface, a polymer containing polyvinyl alcohol structural units may be used in place of or in addition to a cellulose derivative. Since cellulose derivatives are derived from natural cellulose, there is a problem that it is very difficult to maintain quality stability.

The polymer containing polyvinyl alcohol structural units may be an any polymer which contains polyvinyl alcohol structural units. For example, the polymer containing polyvinyl alcohol structural units may simply be polyvinyl alcohol, or may be a mixture containing a polyalkylene oxide such as polyethylene glycol, in addition to polyvinyl alcohol. Further, the polymer containing polyvinyl alcohol structural units may include, for example, polyvinyl alcohol structural units in the main chain or side chain of the polymer, and further, a part of the polyvinyl alcohol structural units may be substituted with an acyloxy group. Examples of the polymer containing polyvinyl alcohol structural units in the polymer main chain include polyvinyl alcohol-polyalkylene oxide graft copolymers containing polyvinyl alcohol structural units in the main chain thereof and polyalkylene oxide structural units in the side chain thereof, and the polyalkylene oxide structural units may include at least one selected from the group consisting of ethylene oxide, propylene oxide, and a combination thereof. In such a copolymer, the polyvinyl alcohol structural units and the polyalkylene oxide structural units may be present in the range of, for example, a molar ratio of 95:5 to 60:40, or 90:10 to 70:30.

Preferable examples of such a copolymer include polyvinyl alcohol-polyethylene oxide graft copolymers represented by the following general formula (3):

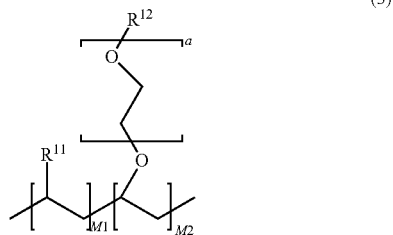

(3)

wherein $R^{11}$ is a hydroxyl group, or an acyloxy group represented by R'COO— (wherein R' is a $C_1$ to $C_8$ alkyl group) (e.g., a $CH_3COO$— group), R 2 is a hydrogen atom, or an acyl group represented by R"CO— (wherein R" is a $C_1$ to $C_8$ alkyl group) (e.g., a $CH_3CO$— group), a is an integer from 1 to 10,000, M1 and M2 are respectively real numbers greater than 0 mol % and less than 100 mol %, and M1+M2=100 mol %. The copolymer of general formula (3) may have a structure in which $R^{11}$ is a mixture of hydroxyl groups and acyloxy groups, and more specifically a structure in which part of the acyloxy groups are saponified to hydroxyl groups. The degree of saponification in this case is not particularly limited, and may be 70 to 100%, 80 to 100%, 90 to 100%, or 95 to 100%. The values of M1 and M2 can be appropriately determined in accordance with the abundance ratio of the polyvinyl alcohol structural units constituting the main chain and the polyethylene oxide structural units constituting a side chain.

More specific examples of the polyvinyl alcohol-polyethylene oxide graft copolymers of general formula (3) include polyvinyl alcohol-polyethylene oxide graft copolymers represented by the following general formula (3a):

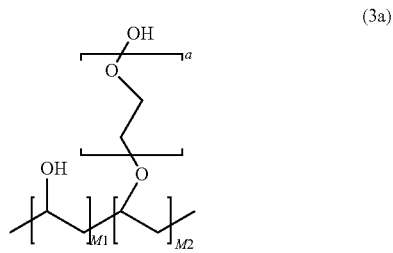

(3a)

wherein a is an integer from 1 to 10,000, M1 and M2 are respectively real numbers greater than 0 mol % and less than 100 mol %, and M1+M2=100 mol %. Part of the hydroxyl groups of the polyvinyl alcohol structural units constituting the main chain in the general formula (3a) may be substituted with an acyloxy group represented by R'COO— (wherein R' is a $C_1$ to $C_8$ alkyl group), and likewise part of the terminal hydroxyl groups of the polyethylene oxide structural units constituting the side chain in the general formula (3a) may be substituted with an acyl group represented by R"CO— (wherein R" is a $C_1$ to $C_8$ alkyl group).

Examples of polymers containing polyvinyl alcohol structural units in the polymer side chain include polyvinyl alcohol-polyalkylene oxide graft copolymers comprising polyalkylene oxide structural units in the main chains and polyvinyl alcohol structural units in the side chain, and the polyalkylene oxide structural units may include at least one selected from the group consisting of ethylene oxide, propylene oxide, and a combination thereof. In such a copolymer, the polyvinyl alcohol structural units and the polyalkylene oxide structural units may be present in the range of, for example, a molar ratio of 95:5 to 60:40 or 90:10 to 70:30.

Preferable examples of such copolymers include polyvinyl alcohol-polyethylene oxide graft copolymers represented by, for example, the following general formula (4):

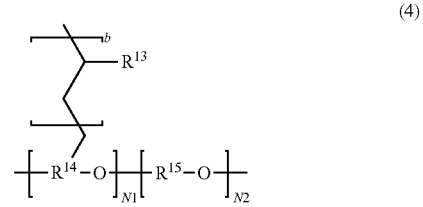

(4)

wherein $R^{13}$ is a hydroxyl group, or an acyloxy group represented by R'COO— (wherein R' is a $C_1$ to $C_8$ alkyl group) (e.g., a $CH_3COO$— group), $R^{14}$ and $R^{15}$ are each independently a linear or branched $C_2$ to $C_3$ alkylene group, b is an integer from 2 to 10,000, N1 and N2 are respectively real numbers greater than 0 mol % and less than 100 mol %, and N1+N2=100 mol %. The copolymer of general formula (4) may have a structure in which R is a mix of hydroxyl groups and acyloxy groups, and more specifically, a structure in which part of the acyloxy groups are saponified to hydroxyl groups. The degree of saponification in this case is not particularly limited, and may be 70 to 100%, 80 to 100%, 90 to 100%, or 95 to 100%. The values of N1 and N2 can be appropriately determined in accordance with the abundance ratio of the polyethylene oxide structural units constituting the main chain and the polyvinyl alcohol structural units constituting the side chain.

More specific examples of the polyvinyl alcohol-polyethylene oxide graft copolymer of general formula (4) include polyvinyl alcohol-polyethylene oxide graft copolymers represented by the following general formula (4a):

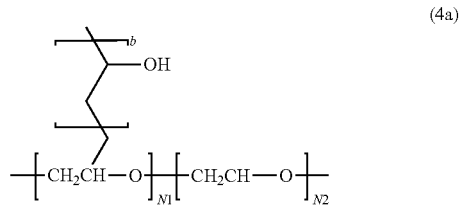

(4a)

wherein b is an integer from 2 to 10,000, N1 and N2 are respectively real numbers greater than 0 mol % and less than 100 mol %, and N1+N2=100 mol %. Part of the hydroxyl groups of the polyvinyl alcohol structural units constituting the side chain of general formula (4a) may be substituted with acyloxy groups represented by R'COO— (wherein R' is a $C_1$ to $C_8$ alkyl group).

When the polymer containing polyvinyl alcohol structural units is polyvinyl alcohol or a mixture of polyvinyl alcohol and polyalkylene oxide, the polyvinyl alcohol and polyalkylene oxide can have an average molecular weight of, for example, 1,000 to 10,000,000. Conversely, when the polymer containing polyvinyl alcohol structural units is the polyvinyl alcohol-polyethylene oxide graft copolymer described above, the polyvinyl alcohol-polyethylene oxide graft copolymer can have an average molecular weight of, for example, 5,000 to 500,000, 10,000 to 300,000, or 10,000 to 200,000.

The polymer containing polyvinyl alcohol structural units may be present in the chemical-mechanical polishing composition in a quantity of, for example, 0.1 ppm or more, 1 ppm or more, 2 ppm or more, or 5 ppm or more, and 5000 ppm or less, 3000 ppm or less, 1000 ppm or less, or 500 ppm or less based on the mass of the aqueous carrier and all of the components which are dissolved or suspended therein. The polymer containing polyvinyl alcohol structural units may be present in the chemical-mechanical polishing composition in a quantity preferably in the range of 0.1 to 5000 ppm (0.00001 to 0.5% by mass), more preferably 1 to 3000 ppm (0.0001 to 0.3% by mass), and particularly preferably 2 to 1000 ppm (0.0002 to 0.1% by mass).

[Other Additives]

The chemical-mechanical polishing composition of the present invention may optionally further contain another additive, such as a polishing speed accelerator, and a chelating agent. Examples of the polishing speed accelerator include a hydroxamic acid (e.g., acetohydroxamic acid), a nitrogen-containing heterocyclic compound (e.g., triazoles such as 1,2,4-triazole), and a combination thereof. Examples of the chelating agent include an organic acid, such as oxalic acid, citric acid, malonic acid, succinic acid, glutaric acid, adipic acid, tartaric acid, and phthalic acid, an amino acid, such as glycine, serine, proline, leucine, alanine, asparagine, glutamine, valine, and lysine, and a polyamine complex, such as ethylenediaminetetraacetic acid (EDTA), hydroxyethylethylenediaminetriacetic acid (HEDTA), nitrilotriacetic acid, iminodiacetic acid, and diethylenetriaminepentaacetic acid (DTPA).

[Rinse Composition]

The rinse composition of the present invention is characterized by comprising:

at least one compound selected from the group consisting of a quaternary polyammonium salt, a quaternary ammonium salt having 6 or more carbon atoms, and an alkylated polymer having an amide structure, and an aqueous carrier.

By washing the substrate after chemical-mechanical polishing using the rinse composition of the present invention, the abrasive or the like remaining on the polishing pad can be removed, and also the same effects as the chemical-mechanical polishing composition of the present invention can be achieved. More specifically, the protrusion on the fringe of the hard laser mark can be reduced specifically in preliminary polishing, and/or the haze of the substrate surface can be reduced in both preliminary polishing and finish polishing. The aforementioned at least one compound may contain two or more out of a quaternary polyammonium salt, a quaternary ammonium salt having 6 or more carbon atoms, and an alkylated polymer having an amide structure. The details of the quaternary polyammonium salt, the quaternary ammonium salt having 6 or more carbon atoms, the alkylated polymer having an amide structure, and the aqueous carrier are as described above in connection with the chemical-mechanical polishing composition of the present invention.

The rinse composition of the present invention may optionally further include tetramethylammonium hydroxide. Tetramethylammonium hydroxide may be present in the rinse composition in the amount of, for example, 0.001% by mass or more, 0.002% by mass or more, 0.005% by mass or more, 0.01% by mass or more, or 0.1% by mass or more, and 10.0% by mass or less, 5.0% by mass or less, 3.0% by mass or less, 1.0% by mass or less, or 0.5% by mass or less based on the mass of the aqueous carrier and all of the components which are dissolved or suspended therein. Tetramethylammonium hydroxide may be be present in the rinse composition preferably in the amount of 0.001 to 10.0% by mass, more preferably 0.005 to 5.0% by mass, and particularly preferably 0.01 to 3.0% by mass.

Furthermore, the rinse composition of the present invention may optionally further include a water-soluble polymer different from the above alkylated polymer having an amide structure. Though not particularly limited, such a water-soluble polymer may be, for example, at least one selected from the group consisting of polyvinylpyrrolidone, polyvinylacetamide, a cellulose derivative, and a polymer containing polyvinyl alcohol structural units. Especially, when polyvinylpyrrolidone and/or polyvinylacetamide is added to the rinse composition of the present invention, a higher haze reducing effect can be obtained compared to a case where these are not added. Polyvinylpyrrolidone and polyvinylacetamide may have any suitable molecular weight. Without limitation, polyvinylpyrrolidone and polyvinylacetamide can have, for example, an average molecular weight of about 500 to about 1,000,000.

In a preferable specific embodiment of the present invention, the water-soluble polymer contains in addition to polyvinylpyrrolidone and/or polyvinylacetamide further a polymer containing a cellulose derivative and/or polyvinyl alcohol structural units. The details of the polymer containing a cellulose derivative and polyvinyl alcohol structural units to be used in the rinse composition of the present invention are as described above in connection with the chemical-mechanical polishing composition of the present invention. The rinse composition of the present invention may optionally further include another additive. The details of such other additive are also as described above in connection with the chemical-mechanical polishing composition of the present invention.

[Method of Chemically-Mechanically Polishing Substrate and Method of Rinsing Substrate]

The chemical-mechanical polishing composition and rinse composition of the present invention can be applied not only to single side polishing in which only one side of a substrate is polished, but also to double side polishing in which both sides of a substrate is polished. For example, when the chemical-mechanical polishing composition and rinse composition of the present invention are used for removing the protrusion on the fringe of the hard laser mark, they are preferably, but without particular limitation, used in in the preliminary polishing step for double side polishing. Meanwhile, when reduction of the haze is their main target, they are preferably used in the finish polishing step for single side polishing. Specific methods of the chemical-mechanical polishing composition and rinse composition of the present invention for use in single side polishing and double side polishing respectively will be described below.

[Method of Chemically-Mechanically Polishing Substrate in Single Side Polishing]

The method of chemically-mechanically polishing a substrate of the present invention comprises:

contacting a substrate with a polishing pad and the chemical-mechanical polishing composition described above, moving the polishing pad relative to the substrate with the chemical-mechanical polishing composition therebetween, and abrading at least a portion of the substrate to polish the substrate.

The method of chemically-mechanically polishing a single side of a substrate according to the present invention is applicable to a chemical-mechanical polishing (CMP) device suitable for polishing a single side of a substrate. Typically, such a device comprises a platen, which moves when used with a velocity resulting from orbital, linear or circular motion, a polishing pad which contacts the platen and moves together with the moving platen, and a carrier which holds the substrate to be polished by moving relative to and in contact with the surface of the polishing pad. Substrate polishing is carried out by bringing a substrate in contact with a polishing pad and the chemical-mechanical polishing composition of the present invention, and thereafter, the polishing pad is moved relative to the substrate so as to abrade at least portion of the substrate, thereby polishing the substrate.

A substrate can be smoothed or polished with a chemical-mechanical polishing composition together with any suitable polishing pad. The substrate may be not only a silicon substrate, but also a silicon substrate on which a polysilicon film, a $SiO_2$ film, or a metal wiring film is formed, a sapphire substrate, a SiC substrate, a GaAs substrate, a GaN substrate, a substrate for forming TSV, or a low resistivity substrate having a resistivity of less than 1 Ω·cm, particularly less than 0.010 Ω·cm, or less than 0.002 Ω·cm, particularly a low resistivity silicon substrate. Examples of a suitable polishing pad include woven and nonwoven polishing pads. Further, a suitable polishing pad can include any suitable polymers having various densities, hardnesses, thicknesses, compressibilities, repellent forces to compression, and compressive moduli. Examples of suitable polymers include poly(vinyl chloride), poly(vinyl fluoride), nylon, fluorocarbon, polycarbonate, polyester, polyacrylate, polyether, polyethylene, polyamide, polyurethane, polystyrene, polypropylene, co-formed products thereof, and mixtures thereof. The polishing pad may be appropriately selected according to the type of a substrate, or the application such as preliminary polishing, or finish polishing.

In addition to a method in which a slurry of the chemical-mechanical polishing composition is prepared in advance and polishing is performed with a polishing pad while supplying the slurry to a substrate, the method of the present invention may be carried out by a method in which a diluent and a slurry stock solution are supplied to a polishing pad, and a slurry for polishing is prepared in the vicinity of the polishing pad.

[Method of Rinsing Substrate in Single Side Polishing]

The substrate rinsing method of the present invention comprises:

contacting a substrate after chemical-mechanical polishing with a polishing pad and the rinse composition described above, and moving the polishing pad relative to the substrate with the rinse composition therebetween.

By washing the substrate after the chemical-mechanical polishing, using the rinse composition of the present invention and the above method, the abrasive, etc. remaining on the polishing pad can be removed, and the same effects as the chemical-mechanical polishing composition of the present invention can be achieved. More specifically, it is possible to reduce the protrusion on the fringe of the hard laser mark, especially in preliminary polishing, and/or to reduce the haze of the substrate surface in both preliminary polishing and finish polishing. The details of the CMP device, the substrate, the polishing pad, etc. used in the method are as described above in connection with the method of chemically-mechanically polishing a substrate.

[Method of Chemically-Mechanically Polishing Substrate in Double Side Polishing]

The method of chemically-mechanically polishing a substrate according to the present invention is a method of chemically-mechanically polishing a substrate using a polishing apparatus provided with an upper platen and a lower platen each having a polishing pad adhered thereto, and a carrier plate having at least one holding hole for holding the substrate, and is characterized by comprising:

holding the substrate in the at least one holding hole of the carrier plate, then sandwiching the carrier plate between the upper platen and lower platen each having the polishing pad adhered thereto, and rotating and revolving the carrier plate to simultaneously polish both sides of the substrate, while supplying the aforementioned chemical-mechanical polishing composition to surfaces to be polished of the substrate.

The method of chemically-mechanically polishing both sides of a substrate according to the present invention is applicable to a chemical-mechanical polishing (CMP) device suitable for polishing both sides of a substrate. Typically, this device is provided with an upper platen and a lower platen each having a polishing pad adhered thereto, and a carrier plate having at least one holding hole for holding the substrate. A plurality of teeth are provided on the outer periphery of the carrier plate holding the substrate, and the carrier plate is sandwiched between the upper platen and the lower platen each having a polishing pad adhered thereto, and the teeth of the carrier plate are engaged with the teeth of a sun gear placed on the central side of the lower platen, and the teeth of an internal gear placed on the circumferential side of the lower platen. In other words, the carrier plate, the sun gear, and the internal gear constitute the mechanism of a planetary gear, and utilizing this mechanism the carrier plate can perform a rotational motion and an orbital motion corresponding to revolution around the central axis of the platen driven by the sun gear, and the internal gear.

For example, utilizing such a CMP device, while supplying a chemical-mechanical polishing composition of the present invention from the vicinity of the lower surface of the upper platen to the surfaces to be polished of a substrate in contact with the lower surface of the upper platen and the upper surface of the lower platen, and causing rotation and revolution of the carrier plate by the above planetary gear mechanism, both sides of the substrate held by the carrier plate are polished at the same time by the polishing pads attached to the lower surface of the upper platen and the upper surface of the lower plate. The details of the substrate and the polishing pads are as described above in connection with single side polishing.

Further, the method of the present invention can be performed also by the means in which a diluent and a slurry stock solution are supplied on to a polishing pad to prepare a polishing slurry in the vicinity of the polishing pad, in addition to the means in which a slurry of a chemical-mechanical polishing composition is prepared in advance, and polishing is carried out with a polishing pad while supplying the slurry to a substrate.

[Method of Rinsing Substrate in Double Side Polishing]

A method of rinsing a substrate according to the present invention is a method of rinsing a substrate using a polishing apparatus provided with an upper platen and lower platen each having a polishing pad adhered thereto, and a carrier plate having at least one holding hole for holding the substrate, and is characterized by comprising:

rotating and revolving the carrier plate, while supplying the aforementioned rinse composition to surfaces to be polished of the substrate after chemically-mechanically polishing.

By washing the substrate after the chemical-mechanical polishing, using the rinse composition of the present invention and the above method, the abrasive, etc. remaining on the polishing pad can be removed, and the same effects as the chemical-mechanical polishing composition of the present invention can be achieved. More specifically, it is possible to reduce the protrusion on the fringe of the hard laser mark, especially in preliminary polishing, and/or to reduce the haze of the substrate surface in both preliminary polishing and finish polishing. The details of the CMP device, the substrate, the polishing pad, etc. used in the method are as described above in connection with single side polishing.

The present invention will be described in more detail below by way of the Examples. However, the present invention is not limited by these Examples in any way.

EXAMPLES

In Examples below, various chemical-mechanical polishing compositions according to the present invention were prepared, and when silicon substrates were polished using these compositions, the effects on reduction of a protrusion on the HLM fringe, reduction of the haze, etc. of the substrate surface were examined.

Example A: Evaluation of HLM, Haze Characteristics, etc.

Preparation of Polishing Composition of Comparative Example 1

The polishing composition of Comparative Example 1 was prepared by adding 21% by mass of colloidal silica (average secondary particle size of 50 to 60 nm), 0.79% by mass of potassium hydroxide (basic component), 2.3% by mass of tetramethylammonium hydroxide (TMAH), 1.31% by mass of potassium hydrogen carbonate (pH buffer), 0.033% by mass of 1,2,4-triazole (corrosion inhibitor), and 0.39% by mass of diethylenetriaminepentaacetic acid (chelating agent) to water.

Preparation of Polishing Composition of Comparative Example 2

The polishing composition of Comparative Example 2 was prepared in the same manner as in Comparative Example 1 except that colloidal silica was added 5 times as much.

[Preparation of Other Polishing Compositions]

Other polishing compositions were prepared in the same manner as in Comparative Example 1 except that various added components set forth in Table 1 below were added, TMAH was not added or the content thereof was changed as necessary, or moreover another water-soluble polymer (polyvinylpyrrolidone: molecular weight of 40,000, or polyvinylacetamide: molecular weight of 50,000) was added.

[Polishing Operation]

First, the back side, which was provided with an HLM bar code, of a commercially available silicon wafer after a grinding treatment (resistivity: 1 Ω·cm or more and less than 100 Ω·cm) was subjected to a chemical-mechanical polishing treatment using a slurry prepared by diluting the above-prepared polishing composition with pure water 21 times (mass ratio) under the following conditions. The pH of the slurry after dilution was about 9.5 to about 11.

(1) CMP device: 12-inch single-sided polishing machine, SPP800S manufactured by Okamoto Machine Works
(2) Wafer head: Template type
(3) Polishing pad: MH S-15A manufactured by Nitta Haas Incorporated
(4) Platen rotation frequency: 32 rpm
(5) Polishing head rotation frequency: 31 rpm
(6) Polishing pressure: 1.45 psi=102 g/cm$^2$=10 kPa
(7) Slurry supply rate: 300 mL/min (free-flowing)
(8) Polishing time: 20 min After polishing, the silicon wafer was washed batchwise at 23° C. for 20 min using a SC-1 (a solution of ammonia (29 mass %-aqueous solution): hydrogen peroxide (31 mass %-aqueous solution): pure water=2:1:10 (volume ratio)). Next, the silicon wafer was scrub-washed at 23° C. using a SC-1 (a solution of ammonia (29 mass %-aqueous solution): hydrogen peroxide (31 mass %-aqueous solution): pure water=1:4:20 (volume ratio)) with an SC-200S manufactured by Shibaura Mechatronics Corporation, and using a PVA brush, and then washed with pure water. The characteristics of the surfaces of the washed silicon wafer were measured and evaluated by the following methods. The results are shown in Table 1 below.

[HLM Protrusion Height]

The height of a protrusion on the HLM fringe (HLM protrusion height) was measured using a stylus profiler (P16 manufactured by KLA-Tencor Corporation) by scanning the upper parts of the dots arranged in the innermost row of the T7 mark according to the SEMI standard. More specifically, the maximum value of the height from the base plane on the wafer surface was determined as the HLM protrusion height (angstrom), and the HLM protrusion height is rated according to the following criteria. A case rated as AA or BB was recognized as pass, while a case rated as CC or DD was recognized as fail.

AA: Less than 0 angstrom (protrusion is completely removed)

BB: Not less than 0 angstrom, and not more than the HLM protrusion height of Comparative Example 2 containing colloidal silica as an abrasive 5 times as much (5.0%), and not containing an added component according to the present invention.

CC: Less than 120% of the HLM protrusion height of Comparative Example 2 DD: Not less than 120% of the HLM protrusion height of Comparative Example 2

[Haze]

The haze was evaluated by a value measured in a dark-field wide oblique incidence channel (DWO) using a Surfscan SP2 manufactured by KLA-Tencor Corporation. More specifically, the obtained haze value (ppm) was rated according to the following criteria, and a case rated as AA or BB was recognized as pass, while a case rated as CC or DD was recognized as fail.

AA: Less than 10 ppm

BB: Not less than 10 ppm and less than 90% of the haze value of Comparative Example 1 not containing an added component according to the present invention CC: Not less than 90% of the haze value of Comparative Example 1 and not more than 110% of the same DD: More than 110% of the haze value of Comparative Example 1

[Si Polishing Speed]

The Si polishing speed was obtained by dividing the mass difference before and after the polishing by the polishing time, and the obtained Si polishing speed (angstrom/min) was rated according to the following criteria.

AA: More than 100% of the Si polishing speed of Comparative Example 1 not containing an added component according to the present invention BB: Not less than 90% of the Si polishing speed of Comparative Example 1, and not more than 100% of the same CC: Less than 90% of the Si polishing speed of Comparative Example 1

TABLE 1

| | Added component | | Colloidal silica (%) | TMAH (%) | Other water-soluble polymer | | Polishing performance | | | Remarks |
|---|---|---|---|---|---|---|---|---|---|---|
| | | | | | | | HLM | | Si | |
| No. | Name | Content (%) | | | Name | Content (%) | protrusion height | Haze | polishing speed | |
| 1 | — | — | 1.0 | 0.110 | — | — | DD | — | — | Comparative Example (Based on Haze, Polishing speed) |
| 2 | — | — | 5.0 | 0.110 | — | — | — | CC | AA | Comparative Example (Based on HLM evaluation) |
| 3 | Hexamethylenebis(trimethyl-ammonium chloride) | 0.048 | 1.0 | 0.110 | — | — | AA | BB | AA | Example |
| 4 | Hexamethylenebis(trimethyl-ammonium chloride) | 0.005 | 1.0 | 0.110 | — | — | BB | CC | BB | Example |
| 5 | Decamethylenebis(trimethyl-ammonium bromide) | 0.048 | 1.0 | 0.110 | — | — | AA | BB | CC | Example |
| 6 | Decamethylenebis(trimethyl-ammonium bromide) | 0.005 | 1.0 | 0.110 | — | — | AA | BB | BB | Example |
| 7 | Ethyltrimethylanmmonium hydoxide | 0.110 | 1.0 | — | — | — | DD | CC | BB | Comparative Example |
| 8 | Tetraethylammonium hydroxide | 0.110 | 1.0 | — | — | — | BB | CC | CC | Example |
| 9 | Tetraethylammonium hydroxide | 0.164 | 1.0 | — | — | — | BB | BB | CC | Example |
| 10 | Tetraethylammonium hydroxide | 0.110 | 1.0 | 0.110 | — | — | BB | BB | CC | Example |
| 11 | Tetraethylammonium hydroxide | 0.164 | 1.0 | 0.164 | — | — | AA | CC | CC | Example |
| 12 | Tetrabutylammonium hydroxide | 0.110 | 1.0 | — | — | — | AA | BB | CC | Example |
| 13 | Tetraethylammonium chloride | 0.110 | 1.0 | 0.110 | — | — | BB | BB | CC | Example |
| 14 | Octyltrimethylammonium chloride | 0.048 | 1.0 | 0.110 | — | — | AA | BB | CC | Example |
| 15 | Octyltrimethylammonium chloride | 0.005 | 1.0 | 0.110 | — | — | BB | BB | CC | Example |
| 16 | Hexadecyltrimethyl-ammonium chloride | 0.005 | 1.0 | 0.110 | — | — | BB | CC | BB | Example |
| 17 | Benzalkonium chloride | 0.005 | 1.0 | 0.110 | — | — | AA | BB | CC | Example |
| 18 | Butylated PVP | 0.004 | 1.0 | 0.110 | — | — | CC | AA | CC | Example |
| 19 | Hexamethylenebis(trimethyl-ammonium chloride) | 0.048 | 1.00 | 0.110 | PVP | 0.0038 | BB | AA | CC | Example |
| 20 | Hexamethylenebis(trimethyl-ammonium chloride)/Butylated PVP | 0.048/0.0038 | 1.00 | 0.110 | | | BB | AA | CC | Example |
| 21 | Hexamethylenebis(trimethyl-ammonium chloride) | 0.048 | 1.00 | 0.110 | Polyvinyl-acetamide | 0.0038 | BB | AA | CC | Example |

* The content of each component means a content after 21-fold dilution.

As obvious from Table 1, in all polishing compositions of Examples containing an added component according to the present invention, the HLM characteristics equal to or higher than those of Comparative Example 2 containing colloidal silica as an abrasive 5 times as much, but not containing an additional component according to the present invention (in the polishing composition of Comparative Example 2, a mechanical polishing power is enhanced by increasing the amount of colloidal silica 5 times), and/or the haze characteristics superior to those of Comparative Example 1 not containing an additional component according to the present invention, can be achieved. Further, as obvious from the results in Table 1, when the contents of added components are equivalent, in a case where an added component composed of a quaternary (poly) ammonium salt having a larger cation moiety is used, higher HLM characteristics can be achieved, and the protrusion can be even completely eliminated. Among these, the polishing compositions of Examples 3 and 4 containing hexamethylenebis (trimethylammonium chloride) as an added component exhibit superior Si polishing speed despite relatively lower content of the added component compared to a case where such a component is not added (Comparative Example 1), which is more preferable. In the polishing compositions of Examples 19 and 21 in which an added component according to the present invention was combined with polyvinylpyrrolidone (PVP), or polyvinylacetamide, not only higher HLM characteristics were obtained, but also excellent haze characteristics were achieved at the same time. Further, although not shown in Table 1, with polishing compositions of Examples 19 and 21 using PVP or polyvinylacetamide, as well as Example 20 using butylated PVP, a tendency that formation of light point defects (LPD) on the substrate surface was also reduced was observed. The compositions containing such water-soluble polymers exhibit excellent haze and LPD characteristics, and therefore can be effectively used not only in the preliminary polishing step, but also in the rinsing and finish polishing step after the preliminary polishing step.

In contrast, the polishing composition of Comparative Example 1 not containing an added component according to the present invention exhibited poor HLM characteristics, and similarly the polishing composition of Comparative Example 2 not containing an added component according to the present invention could not achieve sufficient haze characteristics. Further, the polishing composition of Comparative Example 7 using as an added component ethyltrimethylammonium hydroxide corresponding to a quaternary ammonium salt having 5 carbon atoms exhibited poor HLM characteristics, and could not achieve sufficient haze characteristics.

Example B: Polishing of Low Resistivity Silicon Substrate

In this example, the polishing characteristics were examined for a case where a chemical-mechanical polishing composition of the present invention was used for polishing a low resistivity silicon substrate (size of 8-inch diameter) having a resistivity of less than 0.01 Ω·cm.

Preparation of Polishing Compositions of Comparative Examples

The predetermined amounts of colloidal silica (average secondary particle size of 50 nm or 70 nm), ammonia (basic component), tetramethylammonium hydroxide (TMAH) as necessary, hydroxyethyl cellulose, and/or a polyvinyl alcohol-polyethylene oxide graft copolymer represented by general formula (3a) (polyvinyl alcohol: polyethylene oxide=80:20 mol %, molecular weight: 93,600, saponification degree: 98.5%) were added to water to prepare polishing compositions of Comparative Examples.

Preparation of Polishing Compositions of Examples

Polishing compositions of Examples were prepared in the same manner as in the case of Comparative Examples except that the predetermined amounts of hexamethylenebis(trimethylammonium chloride) were added.

[Polishing Operation]

The aforementioned low resistivity silicon substrate was subjected to a chemical-mechanical polishing treatment using a slurry prepared by diluting the above-prepared polishing composition with pure water so that the content of each component meets the value set forth in Table 2 below under the following conditions. The pH of the slurry after dilution was about 9.5 to about 11.

(1) CMP device: 8-inch single-sided polishing machine, SPP800S manufactured by Okamoto Machine Works
(2) Wafer head: Template type
(3) Polishing pad (preliminary polishing): SUBA840 manufactured by Nitta Haas Incorporated
Polishing pad (finish polishing): SPM3100 manufactured by Nitta Haas Incorporated
(4) Platen rotation frequency (preliminary polishing): 49 rpm
Platen rotation frequency (finish polishing): 50 rpm
(5) Polishing head rotation frequency (preliminary polishing): 47 rpm
Polishing head rotation frequency (finish polishing): 49 rpm
(6) Polishing pressure: 2.9 psi=204 g/cm$^2$=20 kPa
(7) Slurry supply rate (preliminary polishing): 150 mL/min (free-flowing)
Slurry supply rate (finish polishing): 250 mL/min (free-flowing)
(8) Polishing time: 5 min After polishing, the silicon wafer was washed in the same manner as in Example A, then the haze characteristics and the Si polishing speed were measured, and the surface defects (light point defects: LPD) were measured by the following method. The results are shown in Table 2 below.

TABLE 2

| | | Added component | Colloidal silica | | | Other water- | | Polishing performance | | | |
| | | | | | | soluble polymer | | Si polishing | | | |
| No. | Polishing | Name | Content (%) | Particle size (nm) | Content (%) | TMAH (%) | | Content (%) | Haze (ppm) | speed (angstrom/min) | LPD (defects/substrate) | Remarks |
|---|---|---|---|---|---|---|---|---|---|---|---|---|
| 22 | Preliminary polishing | — | — | 50 | 1.0 | 0.110 | — | — | 24.27 | 3605 | 128 | Comparative Example |

TABLE 2-continued

| | | Added component | | Colloidal silica | | | Other water-soluble polymer | | Polishing performance | | | |
|---|---|---|---|---|---|---|---|---|---|---|---|---|
| | | | | Particle | | | | | | Si polishing | | |
| No. | Polishing | Name | Content (%) | size (nm) | Content (%) | TMAH (%) | | Content (%) | Haze (ppm) | speed (angstrom/ min) | LPD (defects/ substrate) | Remarks |
| 23 | Preliminary polishing | Hexamethylenebis (trimethylammonium chloride) | 0.048 | 50 | 1.0 | 0.110 | — | | 19.26 | 3972 | 3 | Example |
| 24 | Finish polishing | — | — | 70 | 0.19 | — | Hydroxyethyl cellulose (Mw: 250,000) | 0.1 | 0.31 | 169 | 39 | Comparative Example |
| | | | | | | | Polyvinyl alcohol-polyethylene oxide graft copolymer | 0.05 | | | | |
| 25 | Finish polishing | Hexamethylenebis (trimethylammonium chloride) | 0.006 | 70 | 0.19 | — | Hydroxyethyl cellulose (Mw: 250,000) | 0.1 | 0.07 | 229 | 13 | Example |
| | | | | | | | Polyvinyl alcohol-polyethylene oxide graft copolymer | 0.05 | | | | |
| 26 | Finish polishing | — | — | 70 | 0.23 | — | Hydroxyethyl cellulose (Mw: 1,000,000) | 0.1 | 0.33 | 168 | 9 | Comparative Example |
| 27 | Finish polishing | Hexamethylenebis (trimethylammonium chloride) | 0.011 | 70 | 0.23 | — | Hydroxyethyl cellulose (Mw: 1,000,000) | 0.1 | 0.09 | 178 | 3 | Example |

* The content of each component means a content after 21-fold dilution.

[Measurement of Surface Defects]

The LPD was rated based on an LPD value measured on a washed silicon wafer in the same manner as in the case of haze measurement in a dark-field composite incidence channel (DCO) using a Surfscan SP2 manufactured by KLA-Tencor Corporation. In doing so, preliminary polishing was evaluated for a size of >250 nm, and finish polishing was evaluated for a size of >120 nm.

Table 2 shows whether the polishing compositions of Examples 23, 25 and 27 gave improved results with respect to each property compared to the respectively corresponding Comparative Examples (Comparative Examples 22, 24 and 26, respectively). In other words, with respect to the haze and LPD, improvement can be recognized when the values are lower than those of the corresponding Comparative Examples, while with respect to the Si polishing speed, improvement can be recognized when the values are higher than those of the corresponding Comparative Examples. As obvious from Table 2, when a polishing composition of Example containing an added component according to the present invention was used, the polishing speed in both preliminary polishing and finish polishing could be improved even with respect to a low resistivity substrate, for which, as generally known, chemical-mechanical polishing is difficult, and further the haze characteristics could be improved and formation of surface defects could be reduced.

We claim:

1. A chemical-mechanical polishing composition, comprising:
   an abrasive,
   a basic component,
   at least one compound selected from the group consisting of a quaternary polyammonium salt, and a quaternary ammonium salt having 6 or more carbon atoms, and
   an aqueous carrier,
   wherein the quaternary ammonium salt having 6 or more carbon atoms has following general formula (2):

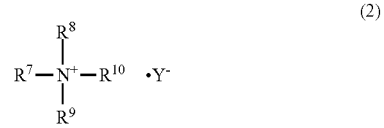

(2)

wherein $R^7$, $R^8$ and $R^9$ are independently a substituted or unsubstituted, linear or branched alkyl group having 1 to 6 carbon atoms, or a benzyl group, $R^{10}$ is a substituted or unsubstituted, linear or branched alkyl group having 7 to 30 carbon atoms, and Y— is a counterion, or
   a cation moiety selected from the group consisting of a methyltriethylammonium ion, a methyltripropylammonium ion, a methyltributylammonium ion, a methyltripentylammonium ion, a methyltrihexylammonium ion, an ethyltripropylammonium ion, an ethyltributylammonium ion, an ethyltripentylammonium ion, an ethyltrihexylammonium ion, a diethyldimethylammonium ion, a propyltrimethylammonium ion, a propyltriethylammonium ion, a propyltributylammonium ion, a propyltripentylammonium ion, a propyltrihexylammonium ion, a dipropyldimethylammonium ion, a dipropyldiethylammonium ion, a butyltrimethylammonium ion, a butyltriethylammonium ion, a butyltripropylammonium ion, a butyltripentylammonium ion, a butyltrihexylammonium ion, a dibutyldimethylammonium ion, a dibutyldiethylammonium ion, a dibutyldipropylammonium ion, a pentyltrimethylammonium ion, a pentyltriethylammonium ion, a pentyltripropylammonium ion, a pentyltributylammonium ion, a pentyltrihexylammonium ion, a dipentyldimethylammonium ion, a dipentyldiethylammonium ion, a dipentyldipropylammonium ion, a dipentyldibutylammonium ion, a hexyltrimethylammonium ion, a hexyltriethylammonium ion, a hexyltripropylammonium ion, a hexyltributylammonium ion, a hexyltripentylammonium ion, a dihexyldimethylammonium ion, a dihexyldiethylammonium ion, a dihexyldipropylammonium ion, a dihexyldibutylammonium ion, a dihexyldipentylammonium ion, a benzylethyldimethylammonium ion, a benzyltriethylammonium ion, a benzyltripropylammonium ion, a benzyltributylammonium ion, a benzyltripentylammonium ion, and a benzyltrihexylammonium ion, and wherein the chemical-mechanical polishing composition has a pH of 7 to 12.

2. The chemical-mechanical polishing composition of claim 1, wherein the at least one compound comprises the quaternary polyammonium salt, and the quaternary ammonium salt having 6 or more carbon atoms.

3. The chemical-mechanical polishing composition of claim 1, wherein the at least one compound comprises the quaternary polyammonium salt, wherein the quaternary polyammonium salt has following general formula (1):

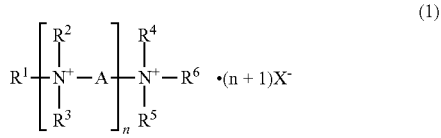

(1)

wherein $R^1$, $R^2$, $R^3$, $R^4$, $R^5$ and $R^6$ are independently a substituted or unsubstituted, linear or branched alkyl group having 1 to 6 carbon atoms, A is independently a substituted or unsubstituted, linear or branched alkylene group having 1 to 30 carbon atoms, n is an integer of 1 to 10, and X— is a counterion.

4. The chemical-mechanical polishing composition of claim 3, wherein the quaternary polyammonium salt is a quaternary diammonium salt, and wherein in the general formula (1), A is a substituted or unsubstituted, linear or branched alkylene group having 1 to 15 carbon atoms, and n is 1.

5. The chemical-mechanical polishing composition of claim 1, wherein the at least one compound comprises the quaternary ammonium salt having 6 or more carbon atoms.

6. The chemical-mechanical polishing composition of claim 1, further comprising an alkylated polymer having an amide structure.

7. The chemical-mechanical polishing composition of claim 1, further comprising tetramethylammonium hydroxide.

8. The chemical-mechanical polishing composition of claim 1, further comprising a water-soluble polymer different from an alkylated polymer having an amide structure.

9. The chemical-mechanical polishing composition of claim 8, wherein the water-soluble polymer comprises at least one selected from the group consisting of polyvinylpyrrolidone, polyvinylacetamide, a cellulose derivative, and a polymer containing a polyvinyl alcohol structural unit.

10. A rinse composition, comprising:
at least one compound selected from the group consisting of a quaternary polyammonium salt, and a quaternary ammonium salt having 6 or more carbon atoms, an aqueous carrier, and
a water-soluble polymer comprising at least one selected from the group consisting of polyvinylacetamide, a cellulose derivative, and a polymer containing a polyvinyl alcohol structural unit in a main chain or side chain of the polymer,
wherein the quaternary ammonium salt having 6 or more carbon atoms has following general formula (2):

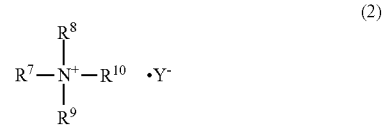

(2)

wherein $R^7$, $R^8$ and $R^9$ are independently a substituted or unsubstituted, linear or branched alkyl group having 1 to 6 carbon atoms, or a benzyl group, $R^{10}$ is a substituted or unsubstituted, linear or branched alkyl group having 7 to 30 carbon atoms, and Y— is a counterion,
or
a cation moiety selected from the group consisting of a methyltriethylammonium ion, a methyltripropylammonium ion, a methyltributylammonium ion, a methyltripentylammonium ion, a methyltrihexylammonium ion, an ethyltripropylammonium ion, an ethyltributylammonium ion, an ethyltripentylammonium ion, an ethyltrihexylammonium ion, a diethyldimethylammonium ion, a propyltrimethylammonium ion, a propyltriethylammonium ion, a propyltributylammonium ion, a propyltripentylammonium ion, a propyltrihexylammonium ion, a dipropyldimethylammonium ion, a dipropyldiethylammonium ion, a butyltrimethylammonium ion, a butyltriethylammonium ion, a butyltripropylammonium ion, a butyltripentylammonium ion, a butyltrihexylammonium ion, a dibutyldimethylammonium ion, a dibutyldiethylammonium ion, a dibutyldipropylammonium ion, a pentyltrimethylammonium ion, a pentyltriethylammonium ion, a pentyltripropylammonium ion, a pentyltributylammonium ion, a pentyltrihexylammonium ion, a dipentyldimethylammonium ion, a dipentyldiethylammonium ion, a dipentyldipropylammonium ion, a dipentyldibutylammonium ion, a hexyltrimethylammonium ion, a hexyltriethylammonium ion, a hexyltripropylammonium ion, a hexyltributylammonium ion, a hexyltripentylammonium ion, a dihexyldimethylammonium ion, a dihexyldiethylammonium ion, a dihexyldipropylammonium ion, a dihexyldibutylammonium ion, a dihexyldipentylammonium ion, a benzylethyldimethylammonium ion, a benzyltriethylammonium ion, a benzyltripropylammonium ion, a benzyltributylammonium ion, a benzyltripentylammonium ion, and a benzyltrihexylammonium ion.

11. The rinse composition of claim 10, wherein the at least one compound comprises the quaternary polyammonium salt, and the quaternary ammonium salt having 6 or more carbon atoms.

12. The rinse composition of claim 10, wherein the at least one compound comprises the quaternary polyammonium salt, wherein the quaternary polyammonium salt has following general formula (1):

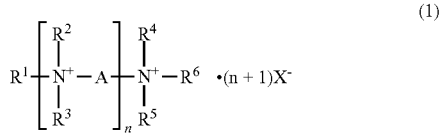

(1)

wherein $R^1$, $R^2$, $R^3$, $R^4$, $R^5$ and $R^6$ are independently a substituted or unsubstituted, linear or branched alkyl group having 1 to 6 carbon atoms, A is independently a substituted or unsubstituted, linear or branched alkylene group having 1 to 30 carbon atoms, n is an integer of 1 to 10, and X— is a counterion.

13. The rinse composition of claim 12, wherein the quaternary polyammonium salt is a quaternary diammonium salt, and wherein in the general formula (1), A is a substituted or unsubstituted, linear or branched alkylene group having 1 to 15 carbon atoms, and n is 1.

14. The rinse composition of claim 10, wherein the at least one compound comprises the quaternary ammonium salt having 6 or more carbon atoms.

15. The rinse composition of claim 10, further comprising an alkylated polymer having an amide structure.

16. The rinse composition of claim 10, further comprising tetramethylammonium hydroxide.

17. The chemical-mechanical polishing composition of claim 4, wherein the quaternary polyammonium salt is hexamethylenebis(trimethylammonium chloride).

18. The chemical-mechanical polishing composition of claim 5, wherein the quaternary ammonium salt having 6 or more carbon atoms has a cation moiety of a methyltributylammonium ion.

19. The rinse composition of claim 13, wherein the quaternary polyammonium salt is hexamethylenebis(trimethylammonium chloride).

20. The rinse composition of claim 14, wherein the quaternary ammonium salt having 6 or more carbon atoms has a cation moiety of a methyltributylammonium ion.

21. The chemical-mechanical polishing composition of claim 6, wherein the alkylated polymer having an amide structure is an alkylated polyvinylpyrrolidone.

22. The rinse composition of claim 15, wherein the alkylated polymer having an amide structure is an alkylated polyvinylpyrrolidone.

* * * * *